(12) United States Patent
Toms

(10) Patent No.: US 7,428,476 B1
(45) Date of Patent: Sep. 23, 2008

(54) SYSTEM AND METHOD OF SIMULATING WITH RESPECT TO SPHEROID REFERENCE MODELS USING LOCAL SURFACE COORDINATES

(75) Inventor: Ralph M. Toms, Tracy, CA (US)

(73) Assignee: Yasumi Capital, LLC, Wilmington, DE (US)

( * ) Notice: Subject to any disclaimer, the term of this patent is extended or adjusted under 35 U.S.C. 154(b) by 652 days.

(21) Appl. No.: 10/213,157

(22) Filed: Aug. 6, 2002

Related U.S. Application Data

(60) Provisional application No. 60/311,412, filed on Aug. 10, 2001.

(51) Int. Cl.
*G06F 17/10* (2006.01)
(52) U.S. Cl. .................. 703/2; 701/213; 702/5
(58) Field of Classification Search .......... 703/2; 701/213; 702/5
See application file for complete search history.

(56) References Cited

U.S. PATENT DOCUMENTS 6,106,561 A * 8/2000 Farmer ................. 703/10

OTHER PUBLICATIONS

Carson, George S. "Spatial Standardization." ACM SIGGRAPH Computer Graphics. Aug. 2000. vol. 34, Issue 3, pp. 38-41.*
Carson, George S. "Standards Pipeline: Work with the SEDRIS Organization Begins." ACM SIGGRAPH Computer Graphics. Feb. 2000. vol. 34, Issue 1, pp. 35-36.*
Fries, Michael. "Multi-dimensional Reactive Elements on Curvilinear Coordinate Systems and Their MDWDF Discretization". 1994 IEEE Int'l Conf. on Acoustics, Speech, and Signal Processing (ICASSP-94). Apr. 1994. vol. 6, pp. VI/9 to VI/12.*
NCGIA Core Curriculum 1990 Version (Last Updated: Aug. 30, 1997). Table of Contents. http://geog.ubc.ca/courses/klink/gis.notes/ncgia/toc.html.*
NCGIA Core Curriculum 1990 Version (Last Updated: Aug. 30, 1997). "Unit 1—What is GIS?". http://geog.ubc.ca/courses/klink/gis.notes/ncgia/u01.html.*
NCGIA Core Curriculum 1990 Version (Last Updated: Aug. 30, 1997). "Unit 26—General Coordinate Systems". http://geog.ubc.ca/courses/klink/gis.notes/ncgia/u26.html.*
NCGIA Core Curriculum 1990 Version (Last Updated: Aug. 30, 1997). "Unit 27—Map Projections". http://geog.ubc.ca/courses/klink/gis.notes/ncgia/u27.html.*
NCGIA Core Curriculum 1990 Version (Last Updated: Aug. 30, 1997). "Unit 28—Affine and Curvilinear Transformations". http://geog.ubc.ca/courses/klink/gis.notes/ncgia/u28.html.*
Prassler, E.A. and E.E. Milios. "Position Estimation Using Equidistance Lines." 1995 IEEE Int'l Conf. on Robotics and Automation. May 21-27, 1995. vol. 1, pp. 85-92.*
Iwatsuki, M. and Okiyama, N. "Preferential Direction Control for Visual Servoing Based on Orthogonal Curvilinear Coordinate Systems." 2003 IEEE/RSJ Int'l Conf. on Intelligent Robots and Systems (IROS 2003). Oct. 27-31, 2003. vol. 1, pp. 761-766.*

(Continued)

*Primary Examiner*—Paul L Rodriguez
*Assistant Examiner*—Mary C Jacob

(57) ABSTRACT

Described are a method and system for describing a position of an entity in a three-dimensional coordinate system with respect to the reference model. The reference model is of a three-dimensional curved surface defined in the three-dimensional coordinate system. The three-dimensional curved surface is divided into a set of cells. Each cell is a subset of the three-dimensional curved surface and has a curved surface. A three-dimensional curvilinear coordinate system is defined for each cell in the set of cells. The three-dimensional curvilinear coordinate system for each cell has a curvilinear axis that extends along the curved surface of that cell.

28 Claims, 6 Drawing Sheets

OTHER PUBLICATIONS

Zayer, R. et al. "Curvilinear Spherical Parameterization." IEEE Int'l Conf. on Shape Modeling and Applications (SMI 2006). Jun. 14-16, 2006.*

Ferguson W.I. et al. "The Construction of Curvilinear CO-ordinate Grid Systems for Reservoir Simulation." (Abstract Only). European Petroleum Conf,, Oct. 20-22, 1986. Available at: http://www.spe.org.*

Thomas, P.D. and Whitney, A.K. "Numerical Generation of 3D Curvilinear Coordinate Systems and Computational Grids for Aircraft Configurations." (Abstract Only). Mar. 1985. Available at: http://stinet.dtic.mil.*

Lee, S. and Soni, B. "Governing Equations of Fluid Mechanics in Physical Curvilinear Coordinate System." Differential Equations and Computational Simulations III. Published Nov. 12, 1998. pp. 149-157.*

Weisstein, E.W. "Curvilinear Coordinates." From MathWord—A Wolfram Web Resource. http://mathworld.wolfram.com/CurvilinearCoordinates.html. Last Modified: Sep. 25, 2003.*

Jones, A. "Where in the World are We?" Resource Information Group, Dept. for Environment, Heritage and Aboriginal Affairs, Government of South Australia. Aug. 1999. http://www.environment.sa.gov.au/mapland/sicom/pdfs/gda94.pdf.*

Birkel, "Sedris Geospatial Reference Model," Jul. 10, 1997, pp. 1-45.

Toms et al., "Choosing a Coordinate Framework for Simulations," pp. 1-10, 1999.

Toms et al., "SEDRIS Coordinate Transformation Services," pp. 1-11, Nov. 1998.

Toms, "Efficient Procedures for Geodetic Transformations," May 1998, pp. 1-13.

\* cited by examiner (GCS)
Prior Art**

(LSC)**

SYSTEM AND METHOD OF SIMULATING WITH RESPECT TO SPHEROID REFERENCE MODELS USING LOCAL SURFACE COORDINATES

RELATED APPLICATION

This application claims the benefit of the filing date of co-pending U.S. Provisional Application, Ser. No. 60/311, 412, filed Aug. 10, 2001, titled "Ellipsoidal Earth Reference Models: A System Using Local Surface Coordinates (LSC)," the entirety of which provisional application is incorporated by reference herein.

FIELD OF THE INVENTION

The invention relates generally to embedded systems and modeling and simulation systems. More particularly, the invention relates to a spatial framework for use by embedded systems and modeling and simulation systems.

BACKGROUND

The technical community has long recognized the benefits of modeling and simulation as a major component of simulation systems, simulator systems, and embedded systems. Certain real-world activities, such as flight training, combat scenarios, missile operations, and fire fighting, are too expensive or too dangerous to test, practice, or use to support analytic studies. Modeling and simulation enables simulated testing, analysis, and personnel training without expending costly resources or exposing personnel to the dangerous situations.

Modeling provides a physical, mathematical, or logical representation of a system, entity, phenomenon, or process. An example of a model is an earth reference model (ERM), which provides a representation of certain aspects of the Earth, such as its shape, mass, and gravity. Simulation is a process of exercising a model over time. Categories of simulation include live simulation, virtual simulation, and constructive simulation. For live simulation, personnel use real-world equipment, such as airplanes, ships, missiles, and vehicles, which perform simulated operations, such as mock combat. For virtual simulation, personnel operate simulators instead of the actual real-world equipment. Constructive simulation involves computerized models of personnel and equipment that may have human interactors or players providing higher level tactics. The actions performed by the personnel and equipment modeled occur entirely within a computer program.

The usefulness of these types of simulations for testing, analyzing, or training depends upon how closely each simulation resembles the real world. The development of computational capabilities (e.g., more memory, faster processors and processing techniques) has improved the realism of some simulations. Yet despite this improvement, computational performance still limits the level of detail, and, thus, the degree of realism, attainable in simulation systems.

The coordinate framework used by a simulation system, for example, to simulate motion dynamics and geometric relations, is a principal factor in computational complexity. Computational complexity means that complex formulations are typically slower to compute than other formulations. Generally, the number of transcendental functions involved in a formulation provides a measure of the computational complexity of that formulation. Examples of transcendental functions include trigonometric functions, the inverse trigonometric functions and other functions such as powers, exponential functions, and logarithms.

Today, simulation systems use a variety of coordinate systems and associated earth reference models. Designers of these systems often assume that the earth is flat (locally) and use localized rectangular coordinates for both dynamic and static spatial referencing. The rectangular coordinates permit simplified mathematical formulation with the promise of acceptable computer runtimes. When employing rectangular coordinates, however, a designer of a typical, computationally intensive application involving Earth geometry makes major modeling compromises, such as gross simplifications to the actual shape of the Earth and to the local environment. These gross simplifications lead to a loss of fidelity that can endanger lives and require expensive subsequent reparations.

The Global Coordinate System (GCS) is an example of one such system that was designed to permit various simplifications to be made to increase processing speed, but such simplifications still compromise the fidelity of the underlying mathematical models. In GCS, the surface of the Earth Reference Model is divided (or tessellated) into nominally 1 degree latitude by 1 degree longitude cells (or tiles). A rectangular canonical local tangent plane (CLTP) coordinate system is defined at the center of each cell. One problem with GCS is that the latitude/longitude cells on the surface do not map to rectangles on each coordinate plane of the CLTP. Another problem is that the curved tessellation cell boundaries do not map to straight lines corresponding to rectangular cells. This introduces gaps or slivers in the surface representation. When the terrain surface is modeled in GCS, gaps may occur into which modeled entities such as vehicles can "disappear." Such terrain skin representations can be repaired but at great expense and loss of fidelity.

In dynamic modeling within the GCS spatial framework, it is often assumed that the acceleration of gravity is normal (i.e., perpendicular) to the local tangent plane centered at the cell center. Because of this assumption, the acceleration of gravity is not normal to the Earth reference model for most points within the cell. This results in inaccurate dynamic formulations. Another simplification made when using GCS is that the vertical distance above each plane is deemed to be the same as geodetic height (height above an oblate spheroid). This simplification produces discontinuities across cell boundaries and modifies real world geometric relationships.

Therefore, there remains a need for a coordinate framework that reduces computational complexity yet avoids the aforementioned problems.

SUMMARY

In one aspect, the invention features a system comprising a reference model of three-dimensional curved surface defined in a three-dimensional coordinate system. The three-dimensional curve surface is divided into a set of cells. Each cell is a subset of the three-dimensional curved surface and itself has a curved surface. The system also includes a three-dimensional curvilinear coordinate system for each cell in the set of cells for describing a position of an entity in the three-dimensional coordinate system with respect to the reference model. The three-dimensional curvilinear coordinate system for each cell has a first curvilinear axis that extends along the curved surface of that cell.

In another aspect, the invention features a curvilinear coordinate system for determining a position of an entity in a three-dimensional coordinate system with respect to a reference model of a three-dimensional curved surface. The three-dimensional curved surface is divided into a set of cells. Each cell is a subset of the three-dimensional curved surface and has a curved surface. The coordinate system includes an origin located on the curved surface of one of the cells in the set of cells, a first curvilinear axis extending along on the curved surface of the one cell through the origin, a second curvilinear axis orthogonal to the first curvilinear axis and extending along on the curved surface of the one cell through the origin, and a rectilinear axis orthogonal to the first and second curvilinear axes and extending through the origin normal to the curved surface of the one cell.

In another aspect, the invention features a method for describing a position of an entity in a three-dimensional coordinate system with respect to a reference model of a spheroid having a three-dimensional curved surface. A set of cells on the three-dimensional curved surface of the reference model is defined. Each cell is a subset of the three-dimensional curved surface and has a curved surface. Also, for each cell in the set of cells, a three-dimensional curvilinear coordinate system is defined. The three-dimensional curvilinear coordinate system has a first curvilinear axis extending along on the curved surface of that cell.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Many application domains, for example, simulations, simulators, embedded systems, operational planning and assessment tools, real-time mission planning, weather prediction, fire fighting, and emergency response, need to point below, on, or above the surface of the Earth. Applications in these domains create and control elements, referred to as entities. Examples of entities in a combat simulation are aircraft, tanks, missiles, and personnel. Commonly, simulation applications control more than one entity. These applications need a well-defined coordinate system. To this end, the present invention features a curvilinear orthogonal local surface coordinate system that provides a description of the location of entities in a three-dimensional coordinate system with respect to a reference model.

Figure 1:
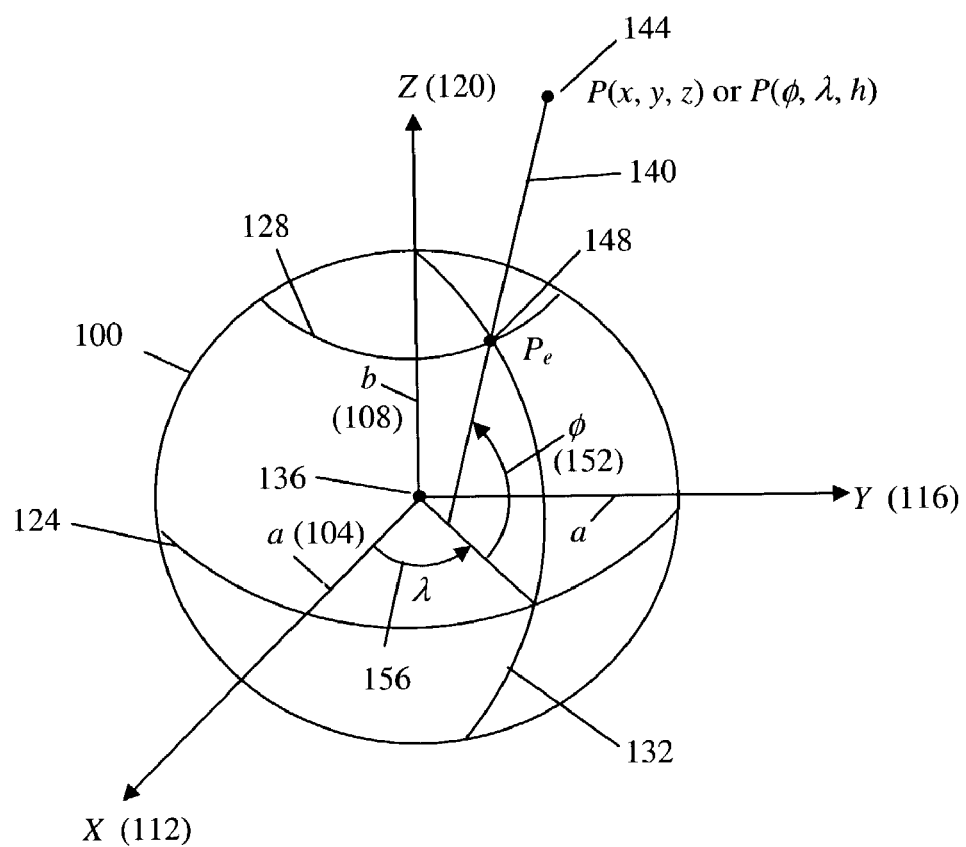
FIG. 1 is a diagram of an embodiment of a reference spheroid having a three-dimensional curved surface and of examples of three-dimensional coordinate systems associated with the reference spheroid.

FIG. 1 shows an embodiment of a reference spheroid 100 used to provide a representative expression of the shape of a planetary body such as the Earth. Generally, the spheroid 100 is a closed, sphere-like surface. Defined mathematically, the spheroid 100 has a shape according to the following equation:

$$\frac{x^2}{a^2} + \frac{y^2}{a^2} + \frac{z^2}{b^2} = 1 \tag{Eq. 1}$$

where a is a semi-major axis 104 and b is a semi-minor axis 108 of the spheroid 100, and x, y and z are coordinates along the X, Y, and Z axes 112, 116, 120 (described further below), respectively.

In one embodiment, the spheroid 100 is an oblate spheroid. That is, the semi-minor axis b 108 of the spheroid 100 is shorter than the semi-major axis a 104. The oblate spheroid has parallels of latitude (e.g., latitudes 124 and 128) and parallels of longitude (e.g., longitude 132). Latitude is the angle $\phi$ that is opposite to and extends to the equatorial plane of the spheroid 100 by a perpendicular through the surface of the spheroid 100 from a point. For geodetic latitude, the perpendicular 140 to the surface does not go through the center 136 of the spheroid 100. For geocentric latitude, the perpendicular 140 passes through the center 136 of the spheroid 100. Longitude (geodetic and geocentric) is the angle $\lambda$, in radians, measured about the minor axis 108 of the spheroid 100 from a prime meridian to the meridian through a point.

In another embodiment, the semi-minor axis b 108 of the spheroid 100 is shorter than or equal to the semi-major axis a 104, which includes the case where the spheroid 100 is a sphere (i.e., a=b). In yet another embodiment, the semi-minor axis b 108 of the spheroid 100 is longer than the semi-major axis a 104 (here, for this embodiment, setting aside the conventional definitions of semi-major and semi-minor). In this instance, the spheroid 100 is a prolate spheroid. By conventional use, the definitions above of latitude and longitude apply to an oblate spheroid. Similar angular measures can be defined for a sphere and for a prolate spheroid.

The spheroid 100 is part of a reference model that may specify parameters that describe the geophysical environment of the planetary body represented by the spheroid 100. Examples of specified parameters include the shape, mass, angular velocity and detailed gravity model of the planetary body. An example of a system that provides an oblate spheroid reference model (i.e., an Earth reference model or ERM) is the WGS84 (World Geodetic System 84) ellipsoid. Although Earth reference models are frequently referred to throughout the description, it is to be noted that the principles of the invention are not limited to the Earth, but apply also to other planetary bodies.

At least one three-dimensional coordinate system is associated with the reference model. Each coordinate system serves to map a point to a location on, above, or below the surface of the spheroid 100. For example, two natural three-dimensional coordinates systems are a geocentric coordinate system (x, y, z) and a geodetic coordinate system (φ, λ, h).

The geocentric coordinate system has three orthogonal rectilinear axes: the X axis 112, the Y axis 116, and the Z axis 120. The origin 136 of the geocentric coordinate system is the center of the spheroid 100. The positive X axis 112 extends from the origin 136 through the prime meridian, the positive Y axis 116 extends through the ninety degree east longitude at the equator, and the positive Z axis 120 extends through the north pole of the spheroid 100.

The geodetic coordinate system has geodetic latitude 152, φ, measured from the equatorial plane, a geodetic longitude 156, λ, measured from the prime meridian, and a geodetic height, h, measured from the surface of the oblate spheroid 100.

The description of the location of an entity in a three-dimensional coordinate system with respect to the reference model depends upon the type of coordinate system used. For example, consider point 144. A line 140 drawn normal from point 144 to the surface of the spheroid 100 intersects the surface at point 148 ($P_e$). In the geocentric coordinate system, the coordinates of the point 144 are of the form P(x, y, z). In the geodetic coordinate system, the coordinates of the point 144 are of the form P(φ, λ, h).

Figure 2:
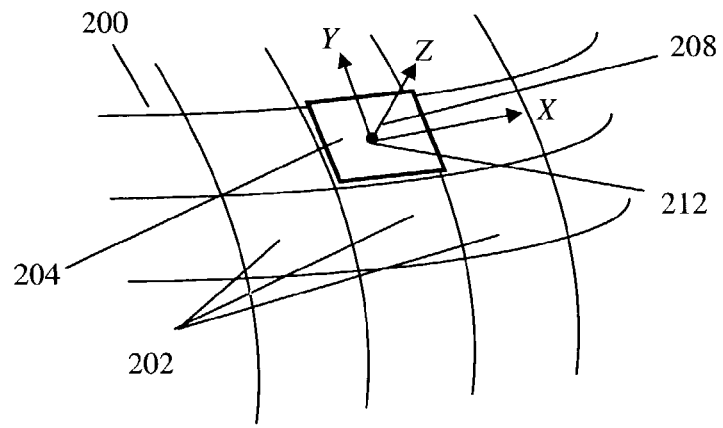
FIG. 2 is a diagram of an embodiment of a tessellation of the three-dimensional curved surface and of a local tangent plane defined in a cell as represented in a prior art coordinate system.

FIG. 2 illustrates a prior art coordinate system called the global coordinate system (GCS). GCS uses the surface of the WGS84 ellipsoid as the Earth reference model. A regular surface grid 200 of cells or tiles 202 covers the surface of the ellipsoid. The cells are nominally defined by a regular 1°×1° latitude-longitude grid. Each latitude-longitude cell has a curved surface according to the curved surface of the ellipsoid and has dimensions of 1 degree latitude by 1 degree longitude. More than 47,000 cells cover the ellipsoid.

At the center 212 of each cell 202, a local tangent plane 204 is formed and a CLTP coordinate system 208 is defined. The coordinate system 208 includes a two-dimensional rectangular coordinate system with axes X and Y in the tangent plane 204. The origin is at the cell center 212 and the Y axis is aligned with the direction of true north along a meridian. The Z axis extends normal to the X-Y tangent plane 204 at the origin to form the three-dimensional canonical local tangent plane (CLTP) coordinate system. More than 47,000 such CLTP coordinate systems exist in GCS, each of which can serve as a basis for a simulation model.

The local tangent plane 204 touches the surface of the cell 202 at the center 212 and, due to the curvature of the cell surface, is separate from and above the surface of the cell 202 at the projected cell boundaries. In FIG. 2, the separation of the local tangent plane 204 from the cell surface at the cell boundaries is exaggerated to illustrate that the local tangent plane 204 does not touch all points on the cell surface.

In theory, each of these CLTP coordinate systems have rectilinear X, Y, and Z axes that extend to infinity. In practice, operations are simulated that are nominally constrained to the underlying latitude-longitude grid 200. When an entity moves from one cell to another the CLTP coordinate system is changed to be consistent with the cell 202 that the entity is in. The projection of the latitude-longitude based cell boundaries on the local tangent plane 204 of the cell 202 generally results in non-linear curves in the local tangent plane 204. This complicates the modeling of terrain surfaces in the local rectangular system. It is conventional to use three-dimensional triangular plates defined in GCS coordinates to fit the terrain surface. Unless care is taken gaps or overlaps in the terrain representation may ensue.

Figure 3A:
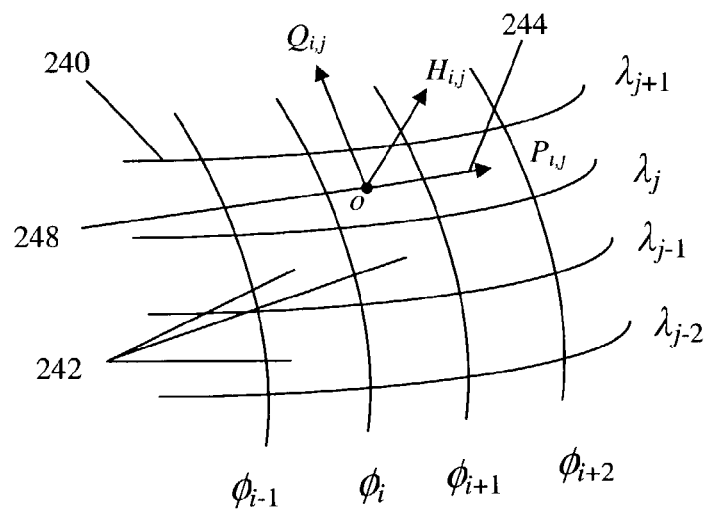
FIG. 3A is a diagram of an embodiment of a division of the three-dimensional curved surface according to the principles of the present invention.

FIG. 3A illustrates a three-dimensional curvilinear orthogonal coordinate system of the present invention, referred to hereafter as a local surface coordinate (LSC) system. The LSC system uses a reference model of a three-dimensional curved surface (e.g., the spheroid 100). The curved surface has non-zero curvature. In one embodiment, the reference model is the WGS84 ellipsoid.

A surface grid 240 of cells 242 (also referred to as a set of cells) covers the three-dimensional curved surface. FIG. 3A shows only a portion of the curved surface and only a portion of the cells are shown with reference numerals. Each cell 242 is a subset of the three-dimensional curved surface and itself has a curved surface. A unique identifier is associated with each cell 242. The cells 242 are non-overlapping and closed. That is, points on the surface within the interior of a cell 242 are in one cell only, and points on the surface on a cell boundary are in each cell that is on that boundary. For example, a point that is on a corner boundary is in four cells.

In general, the size of the cell 242 is adapted to permit accurate geometric approximations (e.g., small angle approximations) described in more detail below. In simulation applications that model line of sight (LOS) between entities on the ground, the distance between the observer and the observed is nominally 5 kilometers. For entities other than those on the ground, the distance generally does not exceed 100 kilometers. Accordingly, a cell size of 1 degree latitude by 1 degree longitude is sufficient to accommodate typical distances between entities. For this cell size, the greatest latitude or longitude between two entities in a cell 242 is 1 degree. Also, these dimensions are the same cell dimensions as those of the GCS, thus legacy simulation and embedded applications that use GCS can be readily adapted to use LSC.

Some other embodiments have smaller cell size dimensions and other embodiments have larger cell size dimensions than 1 degree latitude by 1 degree longitude. A practical upper limit to the size of a cell 242 is an octant of the spheroid surface. Beyond that size, the local surface coordinate system of the cell (described below) no longer uniquely defines each point in that cell.

A three-dimensional curvilinear orthogonal coordinate system (also called a local surface coordinate system) 244 is defined for each cell 242. Each cell 242 has a unique point on the curved surface called an origin o. The origin o can be any one of the points on the curved surface of that cell 242. In one embodiment, the origin o of the local surface coordinate system 244 for each cell 242 is at a point in the interior of the cell 242 called a center 248. In geodetic coordinates, an origin at the center 248 is expressed as: $((\phi_{i+1}-\phi_i)/2, (\lambda_{j+1}-\lambda_j)/2, 0)$. For those embodiments in which the origin o is not at the cell center, a translation of coordinates is employed.

Figure 3B:
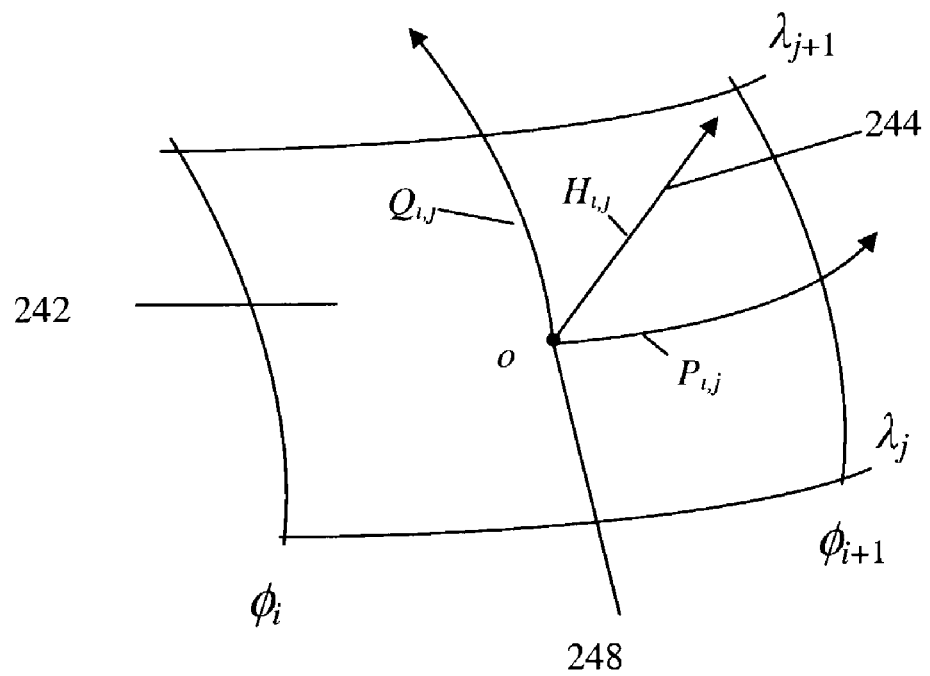
FIG. 3B is a diagram of an embodiment of a cell resulting from the division of the three-dimensional curved surface and of an orthogonal curvilinear local coordinate system defined for that cell according to the principles of the invention.

FIG. 3B shows in more detail the local surface coordinate system 244 for a representative example of the cells 242. The local surface coordinate system 244 for each cell 242 includes a first coordinate curve, called a first curvilinear axis ($P_{i,j}$ axis), that extends on the curved surface of the cell, a second coordinate curve, called a second curvilinear axis ($Q_{i,j}$ axis), that extends on the curved surface of the cell orthogonal to the first curvilinear axis, and a rectilinear axis ($H_{i,j}$ axis) that is normal to the surface of the cell 242 at the origin o. In one embodiment, the origin is at $((\phi_{i+1}-\phi_i)/2, (\lambda_{j+1}-\lambda_j)/2, 0)$, the $P_{i,j}$ axis extends along a parallel of latitude (e.g., easterly), the $Q_{i,j}$ axis extends along a parallel of longitude (or meridian) pointing north, and the $H_{i,j}$ axis is orthogonal to the surface. Points on, above, or below the surface of the cell 242 have local surface coordinates ($p_{i,j}$, $q_{i,j}$, $h_{i,j}$). It is convenient to let $\Delta_i=(\phi_{i+1}-\phi_i)/2$ and $\Delta_j=(\lambda_{j+1}-\lambda_j)/2$ so that the origin of a cell 242 is denoted as ($\Delta_i$, $\Delta_j$, 0).

The $P_{i,j}$ and $Q_{i,j}$ curvilinear axes conform to the curve of the cell surface; that is, unlike the local tangent plane 204 of the GCS (FIG. 2), the $P_{i,j}$ and $Q_{i,j}$ curvilinear axes are on the curved surface of the cell 242 from the cell center 244 to the cell boundaries and beyond if desired. Accordingly, each point that is at a geodetic height of zero ($h_{i,j}=0$) is on the surface of the cell 242. Also, each cell 242 abuts its neighboring cells without forming any gaps or slivers. Consequently, the LSC can maintain continuity of dynamics and geometric space curves across cell boundaries.

Generally, the LSC system defines points ($p_{i,j}$, $q_{i,j}$, $h_{i,j}$) that are used to describe a position of an entity in a three-dimensional coordinate system with respect to the reference model. The definition of local surface coordinates in terms of geodetic coordinates with respect to the reference model depends upon the shape of the spheroid 100. For a spherical reference model, the local surface coordinates $p_{i,j}$, $q_{i,j}$, and $h_{i,j}$ corresponding to a given point ($\phi$, $\lambda$, h) are defined for the cell i,j by:

$$p_{i,j}=(r+h_{i,j})\cos(\phi-\Delta_i)(\lambda-\Delta_j) \text{ and} \quad \text{(Eq. 2)}$$

$$q_{i,j}=(r+h_{i,j})(\phi-\Delta_i), \quad \text{(Eq. 3)}$$

where $h_{i,j}$ is the perpendicular distance from the surface to the given point and r is the fixed radius of the sphere. Defining $\xi_i=\phi-\Delta_i$ and $\eta_j=\lambda-\Delta_j$. Equations 2 and 3 can also be written as $$p_{i,j}=(r+h_{i,j})\cos(\xi_i)\eta_j, \text{ and} \quad \text{(Eq. 3.1)}$$

$$q_{i,j}=(r+h_{i,j})\xi_i. \quad \text{(Eq. 3.2)}$$

Each LSC system has $P_{i,j}$, $Q_{i,j}$, and $H_{i,j}$ axes that extend to infinity but are generally used for points lying in, on or near a cell. The local values of $p_{i,j}$ and $q_{i,j}$ can be viewed as arc length distances from the local origin. The variable $q_{i,j}$ is the arc length of a circular segment of the meridian from the origin to $\phi$. The variable $p_{i,j}$ is the arc length of a segment of a circle on the sphere defined by the intersection of the parallel of longitude through $\lambda$ and the sphere.

For a spherical ERM, the velocity components in the LSC system for the cell i,j are given by $$V_{r\,i,j}=h_{i,j}' \quad \text{(Eq. 3.3)}$$

$$V_{\phi\,i,j}=(r+h_{i,j})\xi_i' \quad \text{(Eq. 3.4)}$$

$$V_{\lambda\,i,j}=(r+h_{i,j})\cos(\xi_i)\eta_j' \quad \text{(Eq. 3.5)}$$

In these equations the prime (') means a derivative with respect to time. The magnitude of the velocity is then given by:

$$V_{i,j}=\sqrt{V_{r\,i,j}^2+V_{\phi\,i,j}^2+V_{\lambda\,i,j}^2}, \quad \text{(Eq. 3.6)}$$

Simplified kinematics equations of motion are used in simulations for motion planning. For movement restricted to the surface of the sphere, where $V_{r\,i,j}=0$ and $h_{i,j}=0$, simplified constant velocity kinematics equations of motion are given by:

$$V_{\phi\,i,j}=r\xi_i'=A_1 \quad \text{(Eq. 3.7)}$$

$$V_{\lambda\,i,j}=r\cos(\Delta_i)\eta_j'=A_2 \quad \text{(Eq. 3.8)}$$

$$V_{i,j}=\sqrt{\left(\frac{A_1}{r}\right)^2+\left(\frac{A_2}{r}\cos(\Delta_i)\right)^2}=A_3 \quad \text{(Eq. 3.9)}$$

where $A_3$ is a constant given by, $$A_3=\sqrt{\left(\frac{A_1}{r}\right)^2+\left(\frac{A_2}{r}\cos(\Delta_i)\right)^2}. \quad \text{(Eq. 3.10)}$$

These kinematic relations are linear in time and are therefore computationally simple (easy to compute). The distance $d_{i,j}$ traveled on the surface of a cell by an entity, assuming constant velocity components, is then given by $$d_{i,j}=A_3 t. \quad \text{(Eq. 3.11)}$$

The distance $d_{i,j}$ is generally not the same as the minimum distance path, which is the arc of a great circle. For small enough cell sizes the difference between the two distance measures is small enough so that movement planning on the surface of the ERM can be supported. For typical planning ranges for ground vehicle entities (less than ten kilometers), the two distance measures are almost indistinguishable. Note that the analogous kinematic path for a CLTP system, such as GCS, generated under the assumption that velocity components are constant, does not lie on the surface of the sphere.

Simple kinematics models can be developed for the spherical case in three dimensions by an approach similar to that described above.

Kinetics formulations can be developed for a CLTP (rectangular coordinate system) with the origin on the surface of an oblate spheroid ERM as described in "Lagrangian Dynamics". D. A. Wells, Schaum's Outline Series, 1967, page 293, Example 14.5. These formulations can then be developed for the case of a spherical or oblate spheroid ERM so that the number of terms involving transcendental functions is minimized. Such kinetic formulations can then be written in terms of a LSC system.

For an oblate spheroid 100, there are two radii of curvature that depend upon latitude, the radius of curvature in the meridian $R_M$ (curvature of a meridian ellipse) and the radius of curvature in the prime vertical $R_N$. The radii are given by:

$$R_M(\phi)=\frac{a(1-\varepsilon^2)}{((1-\varepsilon^2\sin^2(\phi))^{3/2}}; \text{ and} \quad \text{(Eq. 4)}$$

$$R_N(\phi)=\frac{a}{((1-\varepsilon^2\sin^2(\phi))^{1/2}}. \quad \text{(Eq. 5)}$$

where a is the semi-major axis of the spheroid 100 and $\epsilon$ is the eccentricity.

For the i,j cell with an origin at ($\Delta_i$, $\Delta_j$, 0), the local surface coordinates for $p_{i,j}$ and $q_{i,j}$ can be written:

$$p_{i,j}=R_N(\xi_i)\cos(\xi_i)(\eta_j), \text{ and} \quad \text{(Eq. 6)}$$

$$q_{i,j}=S(\xi_i), \quad \text{(Eq. 7)}$$

where $q_{i,j}$ is the arc length of the segment of the meridian ellipse from the local origin to $\phi$. The variable $p_{i,j}$ is the arc length of a segment of a circle in the plane of the parallel of longitude of $\lambda$.

From the calculus, the arc length S from one point $\phi_1$ on an ellipse to another point $\phi_2$ on an ellipse with semi-major axis a is given by:

$$S=\int_{\phi_1}^{\phi_2}R_M(\tau)d\tau=\int_{\phi_1}^{\phi_2}\frac{a(1-\tau^2)}{((1-\varepsilon^2\sin^2(\tau))^{3/2}}d\tau, \quad \text{(Eq. 8)}$$

where $\tau$ is the variable of integration.

For small angle differences $\delta=(\phi_2-\phi_1)$, S can be approximated as $$S(\phi_2-\phi_1)\approx A_0 a(1-\epsilon^2)(\phi_2-\phi_1), \quad \text{(Eq. 9)}$$

where $A_0=1+3\epsilon^2/4+45\epsilon^{4/64}\ldots$ . $\quad$ (Eq. 10)

This approximation to $S(\phi_2-\phi_1)$ has millimeter accuracy for $\phi_i \leq \phi_2 - \phi_1 \leq \phi_{i+1}$ (i.e., within a cell). In this case, with $\xi_i = \phi_2 - \phi_1$, $$S(\xi_i) \approx A_0 a(1-\epsilon^2)(\xi_i). \tag{Eq. 10.1}$$

As a result of the approximation (10.1) and (7), the local surface coordinates can be approximated by:

$$p_{i,j} = R_N(\xi_i)\cos(\xi_i)\eta_j \text{ and;} \tag{Eq. 11}$$

$$q_{i,j} = A_0 a(1-\epsilon^2)\xi_i. \tag{Eq. 12}$$

Since the difference between $\phi$ and $\phi_i$ is less that 0.5 degrees (or less for smaller cells), $\cos(\phi-\phi_i) \approx 1$. In addition, for small cell sizes, $R_N(\phi) \approx R_N(\phi_i)$.

The equations for the local surface coordinates $p_{i,j}$ and $q_{i,j}$ then can be approximated by:

$$p_{i,j} = K_{1i}\eta_j \text{ and;} \tag{Eq. 13}$$

$$q_{i,j} = K_{2i}\xi_i. \tag{Eq. 14}$$

where $K_{1i} = R_N(\Delta_i)$ and $K_{2i} = A_0 a(1-\epsilon^2)$ are assumed to be constants near the i,j th cell. Using Eq. 13 and Eq. 14, simplified kinematic equations of motion are readily derived for an oblate spheroid ERM.

Local Surface Coordinate System Applications

As described above, computational complexity can limit the usefulness of a coordinate system in modeling, simulation, and embedded applications, and transcendental functions, (e.g., trigonometric expressions), generally increase the computational complexity. In general, the LSC system of the present invention avoids transcendental functions in the simulation of movement, terrain skin modeling, line of sight (LOS) determinations, and kinetics.

In simulating movement of an entity from an initial point to a final point in a simulation, there are two distinct phases, planning and simulation. The planning of a path is generally done under assumptions about the nature of the natural environment through which the entity travels. In the planning phase, relatively gross assumptions can be made about the state of the intervening environment between the initial and final points. Such considerations as winds, traffic ability, clouds, obstructions and similar factors can be estimated via a type of average influence. As a result, planned paths are not very accurate and precise models cannot be justified.

In the case of surface ships, the paths used for planning are typically great circle arcs connecting the initial and final points. Some assumptions are that the Earth is modeled as a sphere and that the surface of the water and the surface of the sphere are coincident. In addition, the ship is assumed to move at a constant speed along the arc of the great circle. The average speed may be decreased to account for intervening tides, winds or other environmental conditions. For aircraft, the planned paths are also typically great circle arcs. Again, the planning speed can be adjusted to account for perceived intervening environmental conditions. For land vehicles, when the coordinate system is a local tangent plane system, such as is used in GCS, the planned path is assumed to be in the X-Y plane. Once again, the planning speed can be adjusted for perceived local conditions. Aside from the inability to plan precisely in the face of an unknown environment, path planning is typically performed using two-dimensional maps. Generally, for motion planning models, planning occurs in two dimensions and not in three dimensions.

Because movement planning is done in two dimensions, movement models are typically formulated as kinematic models. That is, the designer specifies the form of the time dependency of the movement model and that form does not involve forces acting on the entity. Generally, the designer selects movement models that are linear in time with respect to the coordinate variables. When the coordinate system is rectangular, motion is linear with respect to the coordinate variables. When the coordinate system is curvilinear, the movement model may be linear in time, but spatial movement may be along a space curve in three-dimensional space. In the case of the local surface coordinates of the invention, the assumption of linearity in time leads to computational simplicity, while the movement paths conform more naturally to the underlying shape of the Earth.

The simulation of movement must account for environmental effects to the extent that such effects are modeled. Generally, such movement models are based on kinetics formulations and are three-dimensional. That is, forces such as drag, friction, and others that act on the entity are modeled using Newtonian laws (F=Ma). In some cases, particularly when the entities are ground vehicles, kinematics formulations are employed in the simulation of movement. However, these kinematics formulations are employed in three dimensions. When kinetics models are based on rectangular coordinates, particularly local tangent plane systems, certain fundamental forces such as those due to the acceleration of gravity have components on all three axes. These components always involve direction cosines of latitude and longitude (that is, the components require trigonometric values of latitude and longitude). Such formulations are computationally complex and relatively slow to compute.

When the equivalent kinetics equations are derived in terms of the local surface coordinates of the invention, the acceleration of gravity acts along the vertical axis of each localized local surface coordinate system. In addition, the kinetics equations can be formulated so that the velocity and acceleration terms of the equations of motion contain no trigonometric functions. Because of these observations, the local surface coordinate formulations are relatively simpler in a computational sense than formulations in rectangular coordinates. To achieve equivalent computational simplicity when using rectangular coordinates requires the use of approximations wherein "small" terms are set to zero. Such an approach inevitably leads to unacceptable inconsistencies in results.

Figure 4:
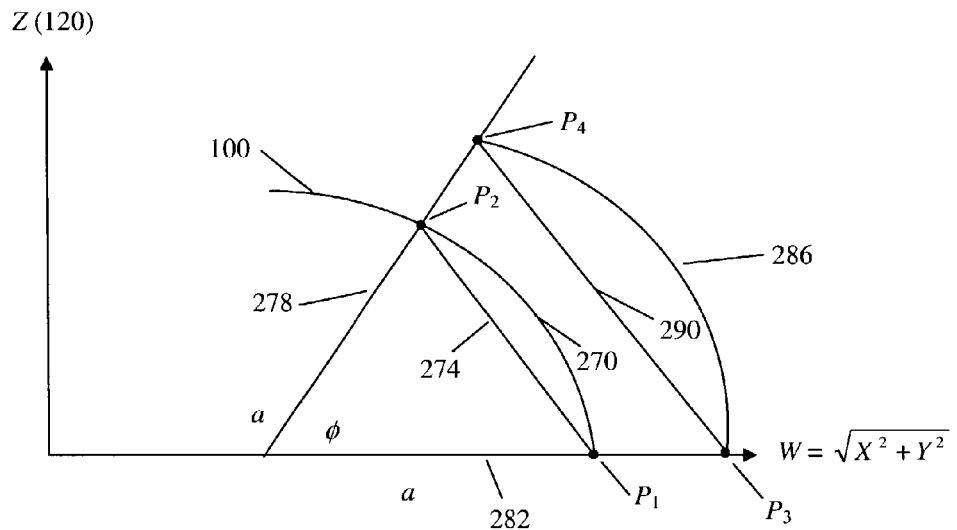
FIG. 4 is a two-dimensional representation of an embodiment of a constant angular velocity path determined in accordance with the principles of the invention.

FIG. 4 illustrates the use of local surface coordinates in the modeling and computation of movement (of an entity). Consider, for example, an entity moving from point $P_1$ and point $P_2$ on the surface of the spheroid 100 (i.e., h=0) along a meridian. The path 270 taken by the entity is a circular arc (in the case where the spheroid 100 is a sphere). Some prior art coordinate systems, e.g., GCS, model the ground movement as a straight line 274 between the points $P_1$ and $P_2$. This movement is unnatural because the line 274 passes through the spheroid surface (i.e., goes underground). As another example, consider a path 286 taken by an entity (e.g., an aircraft) at a constant altitude h between points $P_3$ and $P_4$ Again, some prior art coordinate systems model this movement as a straight line 290 between the points $P_3$ and $P_4$, which is unnatural. A modified version of GCS models the movement along the circular paths 270 and 286 by breaking the curves into many short straight line segments. However, the process is computationally intensive and piecewise is unnatural.

In contrast, the LSC system of the invention models the movement along the circular arcs 270 and 286, which are more natural than the paths 274 and 290, respectively, and computes the constant velocity path using linear functions. Consider that the line segments 278, 282 to point $P_1$ and point $P_2$, respectively, have lengths "a", then the length of path 270 from point $P_1$ to point $P_2$ is given by $$s = a(\phi - \phi_0). \quad \text{(Eq. 15)}$$

Various principles of the LSC system for a spherical reference model are evident. For one, constant velocity paths along any one axis ($P_{i,j}$, $Q_{i,j}$, or $H_{i,j}$), when the other two variables remain constant, are linear in time. For example, constant velocity "parallel" to the $Q_{i,j}$ axis is linear in time when $h_{i,j}$ and $p_{i,j}$ are constants. Also, constant velocity paths in localized $p_{i,j}$, $q_{i,j}$, $h_{i,j}$ surface coordinates are linear in time and linear functions of spatial coordinates $p_{i,j}$, $q_{i,j}$, and $h_{i,j}$. That is, viewing $p_{i,j}$, $q_{i,j}$, $h_{i,j}$ space as a rectangular system, $p_{i,j}$, $q_{i,j}$, $h_{i,j}$ satisfy the parametric equations of a line.

Figure 5:
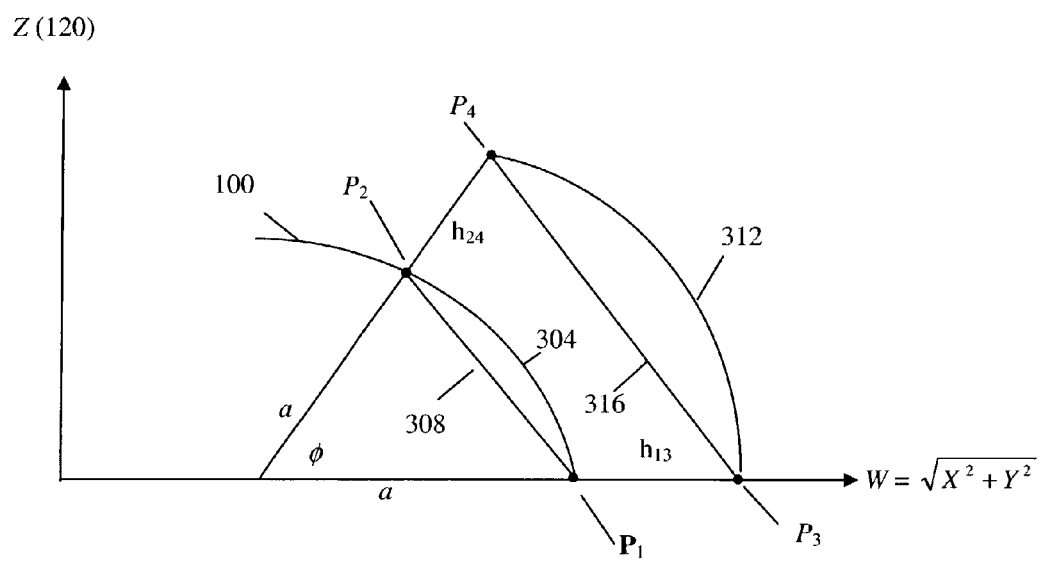
FIG. 5 is a two-dimensional representation of an embodiment of terrain skin model performed in accordance with the principles of the invention.

FIG. 5 illustrates the use of local surface coordinates for terrain skin modeling along a meridian of the spheroid (here, a sphere). In brief overview, the reference model of the spheroid 100 provides a smooth surface, but the real world has terrain. Typically, terrain data, for example, latitude, longitude and height, are collected from the four corners of a cell (here, a cell is determined by longitude and latitude demarcations) and archived in a real-world coordinate framework with respect to a standard ERM (e.g., the WGS84 ellipsoid). For use in a particular coordinate system (e.g., GCS), the terrain data is converted from the real-world coordinate framework into the coordinate framework of the particular coordinate system. The terrain skin is then modeled from the terrain data.

In FIG. 5, points $P_1$, $P_2$, $P_3$, and $P_4$ are terrain height data. Points $P_1$ and $P_2$ are on the three-dimensional curved surface of the spheroid 100, point $P_3$ is at height $h_{13}$ and point $P_4$ is at height $h_{24}$. The curve 304 on the surface between points $P_1$ and $P_2$ appears natural for terrain skin with h=0, whereas the straight line 308 between points $P_1$ and $P_2$ is unnatural (i.e., the line passes through the terrain). Similarly, the curve 312 between points $P_3$ and $P_4$ appears more natural for a terrain model than the straight line 316.

Figure 6:
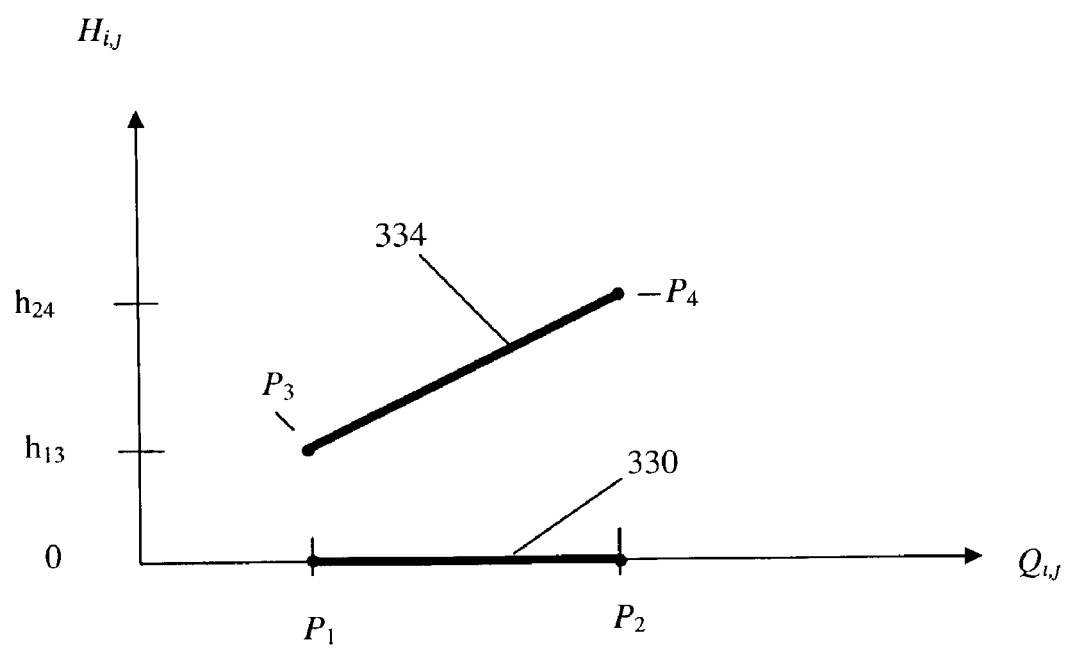
FIG. 6 is a graph showing an embodiment of a linear relationship between height h and q for terrain skin modeling in accordance with the principles of the invention.

As with computing constant velocity paths, prior art implementations model the terrain skin by using the straight lines 308 and 316 or by breaking the curve 304 and 312 into many short straight line segments. In contrast, terrain skin modeling in the LSC system of the invention is linear and of a more natural form (i.e., the terrain skin curves with the curvature of the three-dimensional curved space). In essence, cellular-based local surface coordinates reduce computational complexity, while retaining the natural geometric properties of the Earth curvature when approximating terrain skin models. FIG. 6 illustrates the linear relationship between height h and q in the LSC system. For example, the equation for modeling the terrain skin from point $P_1$ to point $P_2$ is h=0 (represented by line 330) and for modeling the terrain skin between point $P_3$ to point $P_4$ is h=$h_{13}$ (a constant, provided points $P_3$ and $P_4$ are at the same height ($h_{13}$=$h_{24}$)). If points $P_3$ and $P_4$ are at different heights, the terrain skin model is obtained from the equation of the line 334 between points $P_3$ and $P_4$.

Figure 7:
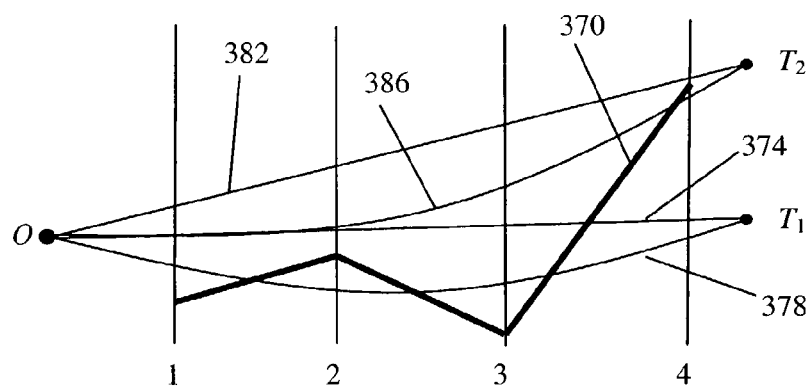
FIG. 7 is a two-dimensional graphical representation of a line-of-sight computation performed in accordance with the principles of the invention.

FIG. 7 illustrates the use of local surface coordinates for computing a line of sight (LOS) between an observer (O) and a first target ($T_1$) and between the observer O and a second target $T_2$. In real-world coordinates, LOS lines are modeled as straight lines between the observer O and the targets $T_1$ and $T_2$. In local surface coordinates, the straight LOS lines between the observer O and the targets $T_1$ and $T_2$ are curved. Computing LOS is simpler using straight lines than using curves. Thus, in the LSC system of the invention, a process for determining LOS between the observer O and the targets $T_1$ and $T_2$ uses straight lines to determine initially if the terrain blocks the respective LOS. If the terrain blocks the straight line, the curve is blocked, and there is no clear line of sight. If the terrain does not block the straight line, then the LOS process uses a height correction to the terrain, described below, to determine if the terrain blocks the curve. In this way, computing LOS in the LSC system involves evaluating linear equations instead of the curves.

In FIG. 7, the terrain is shown in bold. A first line 374 and a first curve 378 pass between the observer O and the target $T_1$. The first curve 378 is below, i.e., is lower in height than, the first line 374. The LOS process of the invention determines whether the terrain blocks the line 374. If so, then the terrain also blocks the curve 378. In this example, the terrain segment 370 between locations 3 and 4 blocks the first line 374, and thus the LOS between the observer O and the target $T_1$. Because the terrain 370 blocks the line 374, the LOS process concludes that the terrain also blocks curve 378.

Also in FIG. 7, a second line 382 and a second curve 386 pass between the observer and the target $T_2$. The second curve 386 is below the second line 382. In this example, the line 382 does not pass through any part of the terrain between the observer O and the target $T_2$, but the second curve 386 does.

The LOS process of the invention computes first the line of sight according to the line 382 and determines initially that there may be a clear line of sight between the observer O and the target $T_2$. The LOS results at this point, however, are inconclusive because the curve 386 can still pass through the terrain although the line 382 does not. This situation is illustrated in FIG. 7. Before concluding that the curve 386 does not pass through the terrain, the LOS process performs a height correction (described below) and computes again whether the line 382 to the target $T_2$ now passes through the terrain. In one embodiment, the height correction is used to lower or raise the target $T_2$. In another embodiment, the height correction is used to adjust the terrain. If after the height correction, the line 382 does not pass through the terrain, then the LOS process deems the observer O to have a clear line of sight to the target $T_2$. If the line 382 is now blocked, the observer O does not have a clear line of sight.

Figure 8:
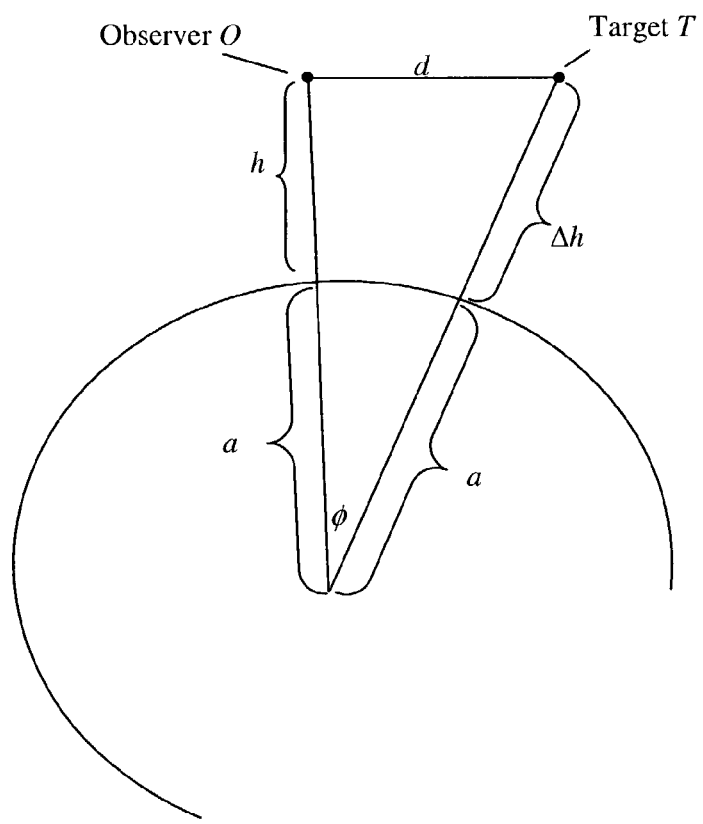
FIG. 8 is a two-dimensional graphical representation of a height correction computation used in performing line-of-sight computations.

FIG. 8 illustrates an embodiment of a technique for determining a height correction to be used in LOS computations. The technique, referred to as Saggatis or Arrow, corrects for the curvature of the Earth. The LOS process described above uses this technique to produce a height-correction value that is used to adjust to the height of the target or terrain. The following equation yields the height correction value ($\Delta h$):

$$\Delta h = \frac{d}{\cos(\phi)} - (a + h) \approx \frac{d^2}{2a}. \quad \text{(Eq. 16)}$$

The accuracy of the approximation improves as $\phi$ goes to 0. For distances of less than approximately 30 kilometers between the observer and target, an approximation of $d^2$ as $h^2 + q^2$ obviates the need to evaluate the computationally complex nonlinear function required for the exact computation of $d^2$.

While the invention has been shown and described with reference to specific preferred embodiments, it should be understood by those skilled in the art that various changes in form and detail may be made therein without departing from the spirit and scope of the invention as defined by the following claims.

What is claimed is:

1. A system comprising:
   a processor; and
   a memory including computer-readable instructions stored therein that, upon execution by the processor, perform operations comprising:

defining a reference model of a geophysical environment as a surface of a spheroid in a three-dimensional, geodetic coordinate system;

dividing at least a portion of the defined reference model into a plurality of cells;

defining a three-dimensional coordinate system for each cell of the plurality of cells, wherein the three-dimensional coordinate system defined for a cell of the plurality of cells comprises a first curvilinear axis that extends along a first curved surface of the cell, the first curved surface defined based on the reference model, a second curvilinear axis that extends along a second curved surface of the cell, the second curved surface defined based on the reference model, the second curvilinear axis orthogonal to the first curvilinear axis at an origin of the three-dimensional coordinate system, and a third axis perpendicular to the curved surface of the cell at the origin of the three-dimensional coordinate system and orthogonal to the first curvilinear axis and the second curvilinear axis;

identifying a cell in which an entity is located;

generating a location of the entity in terms of the three-dimensional coordinate system of the identified cell of the geophysical environment; and storing the generated location of the entity defined in the three-dimensional coordinate system.

2. The system of claim 1, wherein the plurality of cells are non-overlapping.

3. The system of claim 1, wherein the origin is located at a center of the cell.

4. The system of claim 1, wherein the third axis is a rectilinear axis.

5. The system of claim 4, wherein a principle force acts parallel to the rectilinear axis.

6. The system of claim 1, wherein the spheroid is a sphere.

7. The system of claim 1, wherein the spheroid is an oblate spheroid.

8. The system of claim 1, wherein the first curvilinear axis extends along a parallel of a latitude of the spheroid.

9. The system of claim 1, wherein the second curvilinear axis extends along a parallel of a longitude of the spheroid.

10. The system of claim 1, wherein the spheroid is a prolate spheroid.

11. The system of claim 1, wherein each cell has dimensions of 1 degree longitude by 1 degree latitude.

12. The system of claim 1, wherein a principle force acts parallel to the first curvilinear axis.

13. The system of claim 1, wherein the origin for the cell is at any one of the points on the curved surface of the cell.

14. A method for determining a location of an entity the method comprising:

dividing at least a portion of a reference model of a geophysical environment into a plurality of cells, the reference model defined as a surface of a spheroid in a three-dimensional, geodetic coordinate system;

defining a three-dimensional coordinate system for each cell of the plurality of cells, wherein the three-dimensional coordinate system comprises a first curvilinear axis extending along a first curved surface of the cell, the first curved surface defined based on the reference model, a second curvilinear axis that extends along a second curved surface of the cell, the second curved surface defined based on the reference model, the second curvilinear axis orthogonal to the first curvilinear axis at an origin of the three-dimensional coordinate system, and a third axis perpendicular to the curved surface of the cell at the origin of the three-dimensional coordinate system and orthogonal to the first curvilinear axis and the second curvilinear axis;

identifying a cell in which an entity is located;

generating a location of the entity in terms of the three-dimensional coordinate system of the identified cell of the geophysical environment; and storing the generated location of the entity in a memory.

15. The method of claim 14, wherein one of the first and second curvilinear axes extends along a parallel of a latitude of the spheroid and the other of the first and second curvilinear axes extends along a parallel of a longitude of the spheroid.

16. The method of claim 14, further comprising defining the origin to be at a center of the cell.

17. The method of claim 14, wherein the third axis is a rectilinear axis.

18. The method of claim 14, further comprising modeling terrain in the cell using a linear function in the three-dimensional coordinate system.

19. The method of claim 14, further comprising determining whether an unobstructed line of sight exists between an observer and the entity using a linear function.

20. The method of claim 17, wherein determining the line of sight includes computing a height correction.

21. A memory including computer-readable instructions stored therein that, upon execution by a processor, cause the processor to determine a location of an entity, the instructions configured to cause a computing device to:

divide at least a portion of a reference model of a geophysical environment into a plurality of cells, the reference model defined as a surface of a spheroid in a three-dimensional, geodetic coordinate system;

define a three-dimensional coordinate system for each cell of the plurality of cells, wherein the three-dimensional coordinate system comprises a first curvilinear axis extending along a first curved surface of the cell, the first curved surface defined based on the reference model, a second curvilinear axis that extends along a second curved surface of the cell, the second curved surface defined based on the reference model, the second curvilinear axis orthogonal to the first curvilinear axis at an origin of the three-dimensional coordinate system, and a third axis perpendicular to the curved surface of the cell at the origin of the three-dimensional coordinate system and orthogonal to the first curvilinear axis and the second curvilinear axis;

identify a cell in which an entity is located;

generate a location of the entity in terms of the three-dimensional coordinate system of the identified cell of the geophysical environment; and store the generated location of the entity in the computer-readable memory.

22. The memory of claim 21, wherein a gravity force acts parallel to the third axis.

23. The memory of claim 21, further comprising instructions configured to cause a computing device to define the origin to be at a center of the cell.

24. The memory of claim 21, wherein the third axis is a rectilinear axis.

25. The memory of claim 21, wherein a principle force acts parallel to the first curvilinear axis.

26. The memory of claim 21, wherein the spheroid is a sphere.

27. The memory of claim 21, wherein the spheroid is an oblate spheroid.

28. The memory of claim 21, wherein the spheroid is a prolate spheroid.

* * * * *

UNITED STATES PATENT AND TRADEMARK OFFICE
CERTIFICATE OF CORRECTION

PATENT NO. : 7,428,476 B1  Page 1 of 1
APPLICATION NO. : 10/213157
DATED : December 1, 2009
INVENTOR(S) : Ralph M. Toms It is certified that error appears in the above-identified patent and that said Letters Patent is hereby corrected as shown below:

On the title page,

[*] Notice:   Subject to any disclaimer, the term of this patent is extended or adjusted under 35 USC 154(b) by (652) days Delete the phrase "by 652 days" and insert -- by 1033 days --

Signed and Sealed this

Twentieth Day of April, 2010

David J. Kappos
*Director of the United States Patent and Trademark Office*